US011482381B2

(12) United States Patent
Hoshino et al.

(10) Patent No.: US 11,482,381 B2
(45) Date of Patent: Oct. 25, 2022

(54) CERAMIC ELECTRONIC COMPONENT, METHOD OF PRODUCING THE SAME, AND CIRCUIT BOARD

(71) Applicant: TAIYO YUDEN CO., LTD., Tokyo (JP)

(72) Inventors: Ryosuke Hoshino, Takasaki (JP); Satoshi Kobayashi, Takasaki (JP); Yasuaki Uchida, Takasaki (JP); Satsuki Fujii, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 17/194,128

(22) Filed: Mar. 5, 2021

(65) Prior Publication Data
US 2021/0304967 A1    Sep. 30, 2021

(30) Foreign Application Priority Data

Mar. 24, 2020  (JP) .............................. JP2020-052374

(51) Int. Cl.
*H01G 4/30* (2006.01)
*H05K 1/18* (2006.01)
*H05K 1/11* (2006.01)
*H01G 4/012* (2006.01)
*H01G 4/12* (2006.01)
*H01G 4/228* (2006.01)

(52) U.S. Cl.
CPC .............. *H01G 4/30* (2013.01); *H01G 4/012* (2013.01); *H01G 4/12* (2013.01); *H01G 4/228* (2013.01); *H05K 1/111* (2013.01); *H05K 1/181* (2013.01); *H05K 2201/10015* (2013.01)

(58) Field of Classification Search
CPC ........................................................ H01G 4/30
USPC ....................................................... 174/260
See application file for complete search history.

(56) References Cited

U.S. PATENT DOCUMENTS

| 2018/0174754 | A1* | 6/2018 | Kitamura | ............... H01G 4/258 |
| 2019/0318874 | A1* | 10/2019 | Orimo | .................. H05K 3/3442 |
| 2021/0020367 | A1* | 1/2021 | Yun | ........................ H01G 4/232 |
| 2021/0027945 | A1* | 1/2021 | Takahashi | ............ H01G 4/2325 |
| 2021/0057153 | A1* | 2/2021 | Jun | ......................... H01G 4/232 |
| 2021/0082623 | A1* | 3/2021 | Kim | .......................... H01G 4/12 |

FOREIGN PATENT DOCUMENTS

JP       2019201106 A    11/2019

\* cited by examiner

*Primary Examiner* — Stanley Tso
(74) *Attorney, Agent, or Firm* — Law Office of Katsuhiro Arai (57) ABSTRACT

A ceramic electronic component includes: a ceramic body including a pair of end surfaces, and a side surface connecting the pair of end surfaces and including a pair of end regions adjacent to the pair of end surfaces and an intermediate region located between the pair of end regions; and a pair of external electrodes including a pair of base layers that cover the pair of end surfaces and the pair of end regions of the side surface and include outer surfaces, a difference of a surface roughness Ra of the outer surfaces with respect to the intermediate region of the side surface being 40 nm or less, and a pair of plating layers covering the outer surfaces of the pair of base layers and including a pair of extending portions extending from the outer surfaces of the pair of base layers to the intermediate region of the side surface.

13 Claims, 7 Drawing Sheets

CERAMIC ELECTRONIC COMPONENT, METHOD OF PRODUCING THE SAME, AND CIRCUIT BOARD

BACKGROUND ART

The present disclosure relates to a ceramic electronic component including a pair of external electrodes, a method of producing the ceramic electronic component, and a circuit board.

Japanese Patent Application Laid-open No. 2019-201106 discloses a multi-layer ceramic capacitor including external electrodes each including a base layer and a plating layer. In the method of producing the multi-layer ceramic capacitor described in Japanese Patent Application Laid-open No. 2019-201106, the base layer is formed by baking an electrically conductive paste onto a ceramic body, and the plating layer is formed on the base layer by a wet plating method.

SUMMARY OF THE INVENTION

However, in the multi-layer ceramic capacitor having a configuration in which the plating layer is provided on the ceramic body through the base layer as described above, a problem is likely to occur in the plating layer. On the other hand, the inventors of the present application have found that the occurrence of the problem of the plating layer can be reduced by performing specific pretreatment on the ceramic body on which the base layer is formed.

In view of the circumstances as described above, it is desirable to provide a ceramic electronic component in which an external electrode including a base layer and a plating layer is capable of being satisfactorily formed on a ceramic body, a method of producing the ceramic electronic component, and a circuit board.

Additional or separate features and advantages of the disclosure will be set forth in the descriptions that follow and in part will be apparent from the description, or may be learned by practice of the disclosure. The objectives and other advantages of the disclosure will be realized and attained by the structure particularly pointed out in the written description and claims thereof as well as the appended drawings.

To achieve these and other advantages and in accordance with the purpose of the present disclosure, as embodied and broadly described, in one embodiment, the present disclosure provides a ceramic electronic component including a ceramic body and a pair of external electrodes.

The ceramic body includes a pair of end surfaces, and a side surface that connects the pair of end surfaces and includes a pair of end regions adjacent to the pair of end surfaces and an intermediate region located between the pair of end regions.

The pair of external electrodes include a pair of base layers that cover the pair of end surfaces and the pair of end regions of the side surface and include outer surfaces, a difference of a surface roughness Ra of the outer surfaces with respect to the intermediate region of the side surface being 40 nm or less, and a pair of plating layers that cover the outer surfaces of the pair of base layers and include a pair of extending portions extending from the outer surfaces of the pair of base layers to the intermediate region of the side surface.

A contact angle of each of the pair of extending portions with respect to the intermediate region of the side surface is favorably an acute angle.

In such a ceramic electronic component, the extending portion of the plating layer extends from the outer surface of the base layer to the intermediate region of the side surface of the ceramic body. In such a configuration, when the difference of the surface roughness Ra between the outer surface of the base layer and the intermediate region of the side surface of the ceramic body is kept small, it is possible to reduce the contact angle of the extending portion of the plating layer with respect to the intermediate region of the side surface of the ceramic body. Thus, it is possible to suppress the peeling of the external electrode starting from the extending portion of the plating layer.

The pair of base layers may mainly contain nickel.

The pair of base layers may contain a ceramic component.

The difference of the surface roughness Ra between each of the outer surfaces of the pair of base layers and the intermediate region of the side surface may be 30 nm or less.

The surface roughness Ra of each of the outer surfaces of the pair of base layers may be 10 nm or more and less than 200 nm.

The surface roughness Ra of the intermediate region may be 10 nm or more and less than 150 nm.

In another embodiment, the present disclosure provides a method of producing a ceramic electronic component, the method including: preparing a composite sintered body including a ceramic body including a pair of end surfaces, and a side surface that connects the pair of end surfaces, and a pair of base layers that go around the side surface from the pair of end surfaces and are separated from each other on the side surface; performing blast polishing on the composite sintered body; and forming a pair of plating layers on the composite sintered body subjected to the blast polishing by a wet plating method, the pair of plating layers covering outer surfaces of the pair of base layers.

In this configuration, it is possible to uniformly grind the outer surfaces of the base layers by performing blast polishing on the composite sintered body including the ceramic body and the base layers. As a result, the metal oxide generated on the outer surfaces of the base layers during sintering or the like is removed, so that the plating layers can be formed on the outer surfaces of the base layers without unevenness. Additionally, it is possible to keep the difference of the surface roughness Ra between the outer surface of the base layer and the intermediate region of the side surface of the ceramic body small by blast polishing, and thus the configuration capable of suppressing the peeling of the external electrode can be obtained.

The performing blast polishing may include setting a difference of a surface roughness Ra between each of the outer surfaces of the pair of base layers and a region between the pair of base layers on the side surface to 40 nm or less.

The pair of plating layers may include a pair of extending portions extending from the outer surfaces of the pair of base layers to the side surface. In this case, a contact angle of each of the pair of extending portions with respect to the side surface may be an acute angle.

The preparing a composite sintered body may include simultaneously sintering the ceramic body and the pair of base layers.

In still another embodiment, the present disclosure provides a circuit board including the ceramic electronic component described above, a board main body, a pair of terminals, and a solder.

The pair of terminals are provided on the board main body.

The solder bonds the pair of external electrodes and the pair of terminals to each other.

It is possible to provide a ceramic electronic component in which an external electrode including a base layer and a plating layer is capable of being satisfactorily formed on a ceramic body, a method of producing the ceramic electronic component, and a circuit board.

These and other objects, features and advantages of the present disclosure will become more apparent in light of the following detailed description of embodiments thereof, as illustrated in the accompanying drawings.

It is to be understood that both the foregoing general description and the following detailed description are exemplary and explanatory, and are intended to provide further explanation of the disclosure as claimed.

DETAILED DESCRIPTION OF THE EMBODIMENTS

Hereinafter, an embodiment of the present disclosure will be described with reference to the drawings.

The drawings show the X axis, the Y axis, and the Z axis orthogonal to one another as appropriate. The X axis, the Y axis, and the Z axis are common in all figures.

1. Basic Configuration of Multi-Layer Ceramic Capacitor 10

Figure 1:
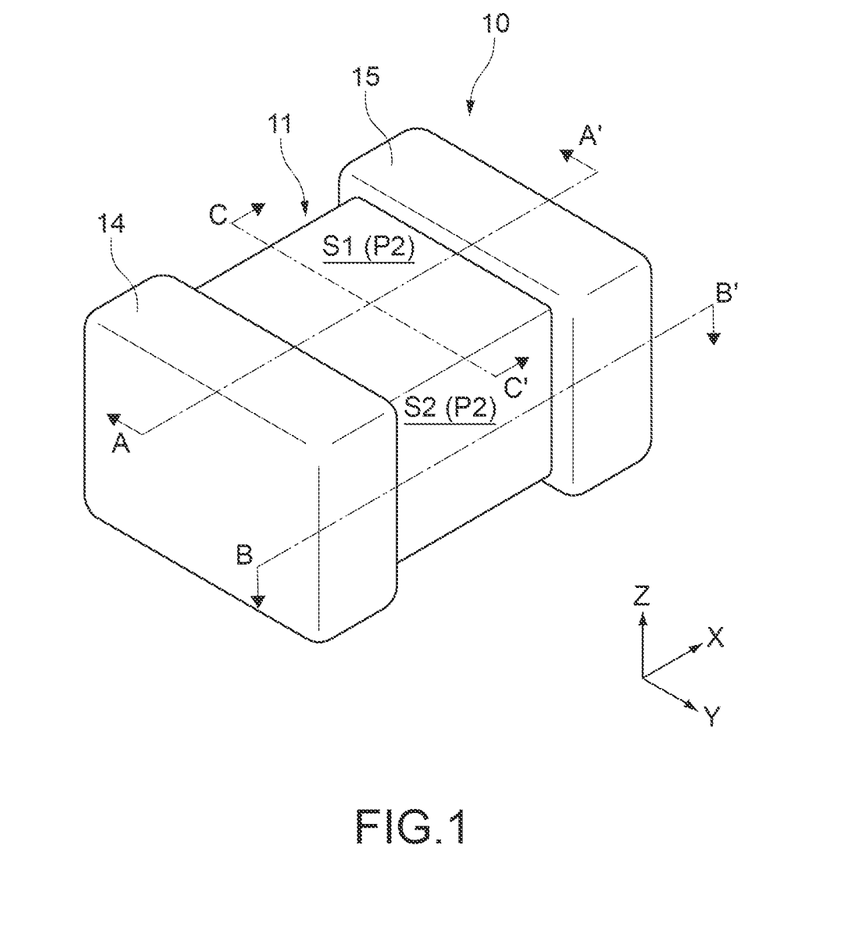
FIG. 1 is a perspective view of a multi-layer ceramic capacitor according to an embodiment of the present disclosure.
Figure 2:
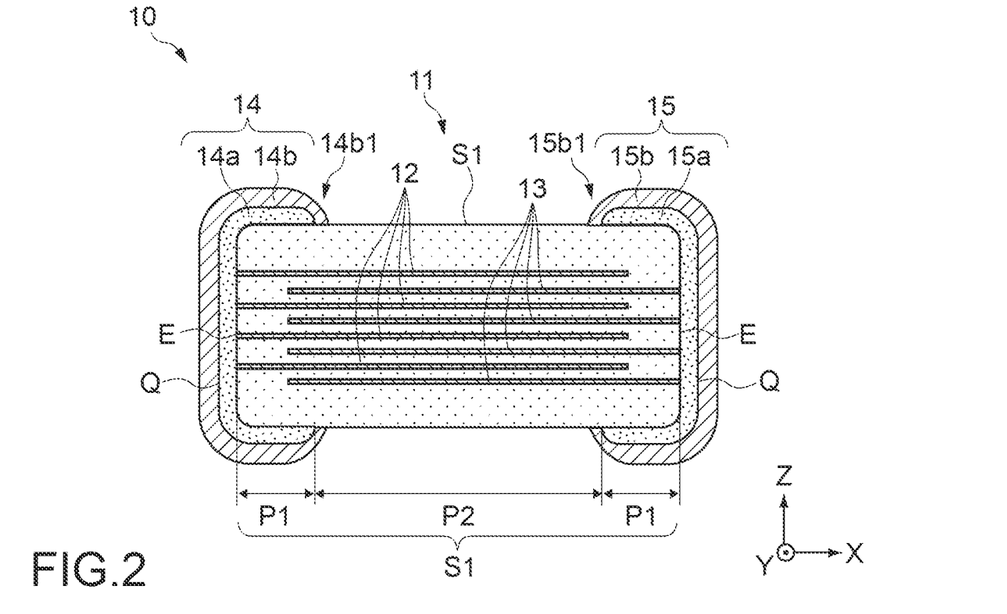
FIG. 2 is a cross-sectional view of the multi-layer ceramic capacitor taken along the A-A' line in FIG. 1.
Figure 3:
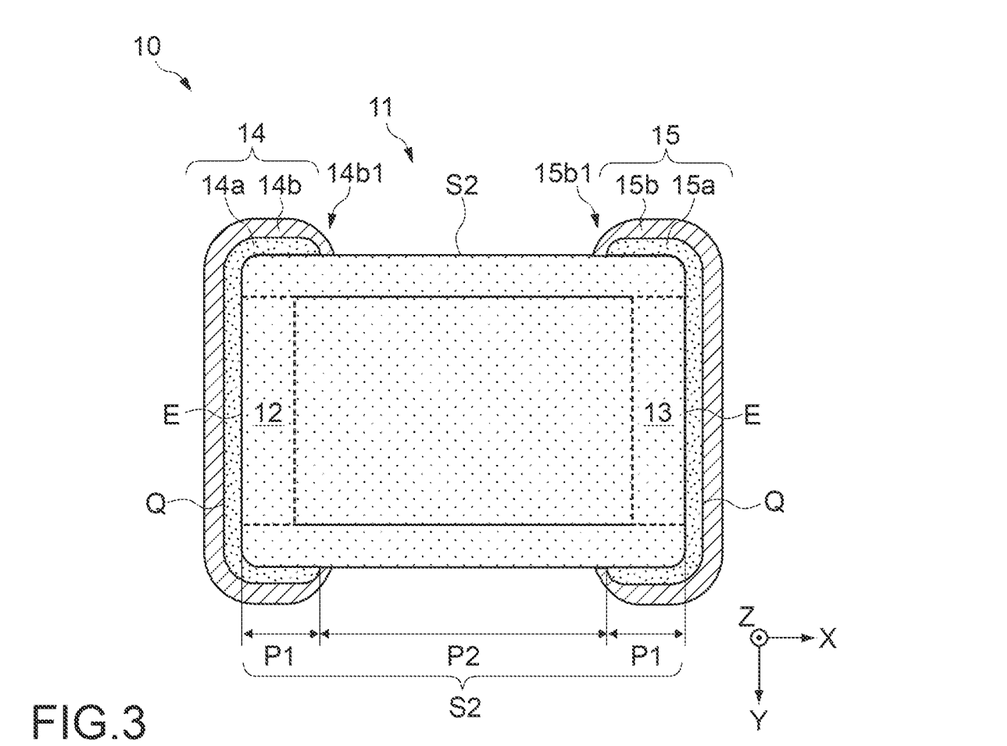
FIG. 3 is a cross-sectional view of the multi-layer ceramic capacitor taken along the B-B' line in FIG. 1.
Figure 4:
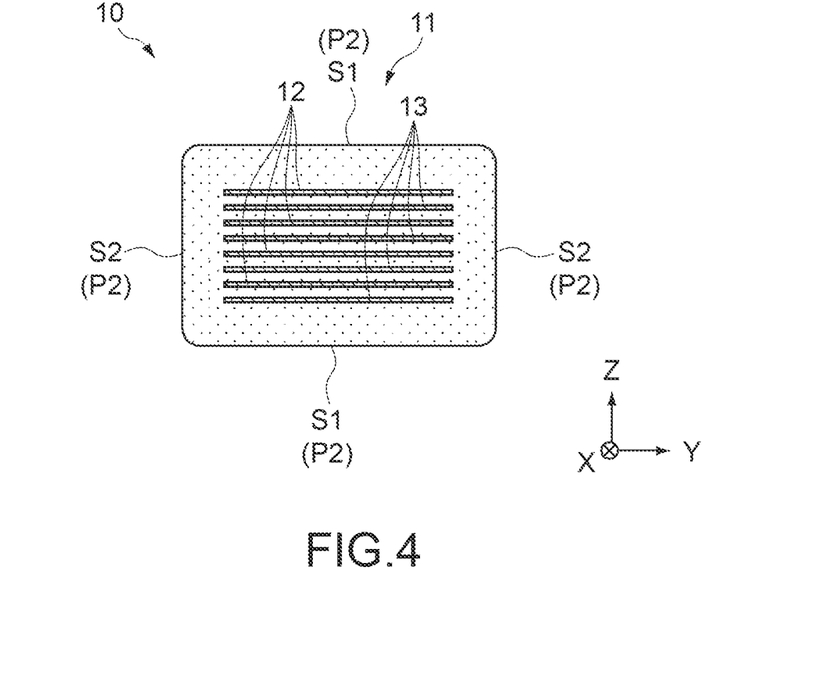
FIG. 4 is a cross-sectional view of the multi-layer ceramic capacitor taken along the C-C' line in FIG. 1.

FIGS. 1 to 4 each show a multi-layer ceramic capacitor 10 according to an embodiment of the present disclosure. FIG. 1 is a perspective view of the multi-layer ceramic capacitor 10. FIG. 2 is a cross-sectional view of the multi-layer ceramic capacitor 10 taken along the A-A' line in FIG. 1. FIG. 3 is a cross-sectional view of the multi-layer ceramic capacitor 10 taken along the B-B' line in FIG. 1. FIG. 4 is a cross-sectional view of the multi-layer ceramic capacitor 10 taken along the C-C' line in FIG. 1.

The multi-layer ceramic capacitor 10 includes a ceramic body 11, a first external electrode 14, and a second external electrode 15. The multi-layer ceramic capacitor 10 can be formed in various sizes according to its application and the like, and as an example, the dimensions thereof along the X axis, the Y axis, and the Z axis can be set to 1.0 mm, 0.5 mm, and 0.5 mm, respectively.

The ceramic body 11 is formed as a hexahedron having the outer surface including a pair of end surfaces E, a pair of first side surfaces S1, and a pair of second side surfaces S2. In the ceramic body 11, the pair of end surfaces E extending parallel to the Y-Z plane are connected along the X-axis direction by the first side surfaces S1 extending parallel to the X-Y plane and the second side surfaces S2 extending parallel to the X-Z plane.

The end surfaces E and the first and second side surfaces S1, S2 of the ceramic body 11 are each formed as a flat surface. The flat surface according to this embodiment does not need to be strictly flat if the surface may be recognized as being flat when viewed as a whole. For example, the flat surface according to this embodiment also includes a surface having fine irregularities thereon, a surface having a gently curved shape in a predetermined range, and the like.

The first and second external electrodes 14, 15 cover both the end surfaces E of the ceramic body 11 and face each other in the X-axis direction with the ceramic body 11 being sandwiched therebetween. The first and second external electrodes 14, 15 go around the first side surfaces S1 and the second side surfaces S2 from the respective end surfaces E of the ceramic body 11 and are spaced apart from each other in the X-axis direction on the first side surfaces S1 and the second side surfaces S2.

The ceramic body 11 is formed of dielectric ceramics. The ceramic body 11 includes a plurality of first internal electrodes 12 and a plurality of second internal electrodes 13 covered with dielectric ceramics. The first and second internal electrodes 12, 13 each have a sheet-like shape extending along the X-Y plane and are alternately disposed along the Z-axis direction.

In other words, the ceramic body 11 includes an opposing region where the first and second internal electrodes 12, 13 face each other in the Z-axis direction with the ceramic layers being sandwiched therebetween. The first internal electrodes 12 are drawn from the opposing region to one end surface E and connected to the first external electrode 14. The second internal electrodes 13 are drawn from the opposing region to the other end surface E and connected to the second external electrode 15.

With such a configuration, when a voltage is applied between the first external electrode 14 and the second external electrode 15 in the multi-layer ceramic capacitor 10, the voltage is applied to the ceramic layers in the opposing region including the first and second internal electrodes 12, 13. This allows the multi-layer ceramic capacitor 10 to store charge corresponding to the voltage applied between the first external electrode 14 and the second external electrode 15.

In the ceramic body 11, in order to increase capacitances of the respective ceramic layers provided between the first and second internal electrodes 12, 13, dielectric ceramics having a high dielectric constant is used. Examples of the dielectric ceramics having a high dielectric constant include a material having a Perovskite structure containing barium (Ba) and titanium (Ti), which is typified by barium titanate ($BaTiO_3$).

Note that the dielectric ceramics may have a composition based on strontium titanate ($SrTiO_3$), calcium titanate ($CaTiO_3$), magnesium titanate ($MgTiO_3$), calcium zirconate ($CaZrO_3$), calcium zirconate titanate ($Ca(Zr,Ti)O_3$), barium zirconate ($BaZrO_3$), titanium oxide ($TiO_2$), or the like.

2. Detailed Configuration of Multi-Layer Ceramic Capacitor 10

The multi-layer ceramic capacitor 10 according to this embodiment has a configuration capable of stably forming favorable first and second external electrodes 14, 15 for the ceramic body 11. Thus, the first and second external electrodes 14, 15 according to this embodiment are likely to obtain favorable connection property for the first and second internal electrodes 12, 13 and to ensure favorable solder wettability at the time of mounting.

Specifically, in the multi-layer ceramic capacitor 10, the first external electrode 14 includes a first base layer 14a and a first plating layer 14b, and the second external electrode 15 includes a second base layer 15a and a second plating layer 15b. The first and second base layers 14a, 15a are each formed as a sintered film of an electrical conductor. The first and second plating layers 14b, 15b are each formed as a wet plating film of metal.

The first and second base layers 14a, 15a are adjacent to the end surfaces E and the first and second side surfaces S1, S2 of the ceramic body 11 and constitute the innermost layers of the first and second external electrodes 14, 15, respectively. Providing the first and second base layers 14a, 15a allows the first and second external electrodes 14, 15 to obtain more reliable connection to the first and second internal electrodes 12, 13 on the end surfaces E of the ceramic body 11.

As shown in FIGS. 2 and 3, each of the first and second side surfaces S1, S2 of the ceramic body 11 includes a pair of end regions P1 located at both ends in the X-axis direction, and an intermediate region P2 located between the pair of end regions P1. The pair of end regions P1 are covered with the first and second base layers 14a, 15a, and the intermediate region P2 is not covered with the first and second base layers 14a, 15a.

The first and second plating layers 14b, 15b are formed over the first and second base layers 14a, 15a to cover the ceramic body 11, and constitute the outermost layers of the first and second external electrodes 14, 15. In the multi-layer ceramic capacitor 10, the first and second plating layers 14b, 15b, which have higher solder wettability than that of the first and second base layers 14a, 15a, are provided as the outermost layers of the first and second external electrodes 14, 15, to thus facilitate the mounting.

The first and second plating layers 14b, 15b include extending portions 14b1, 15b1, respectively. The extending portions 14b1, 15b1 cover the entire outer surfaces Q of the first and second base layers 14a, 15a and further extend beyond the first and second base layers 14a, 15a inwardly along the X-axis direction. The extending portions 14b1, 15b1 of the first and second plating layers 14b, 15b are in direct contact with the intermediate region P2 on the side surfaces S1, S2 of the ceramic body 11.

Figure 5:
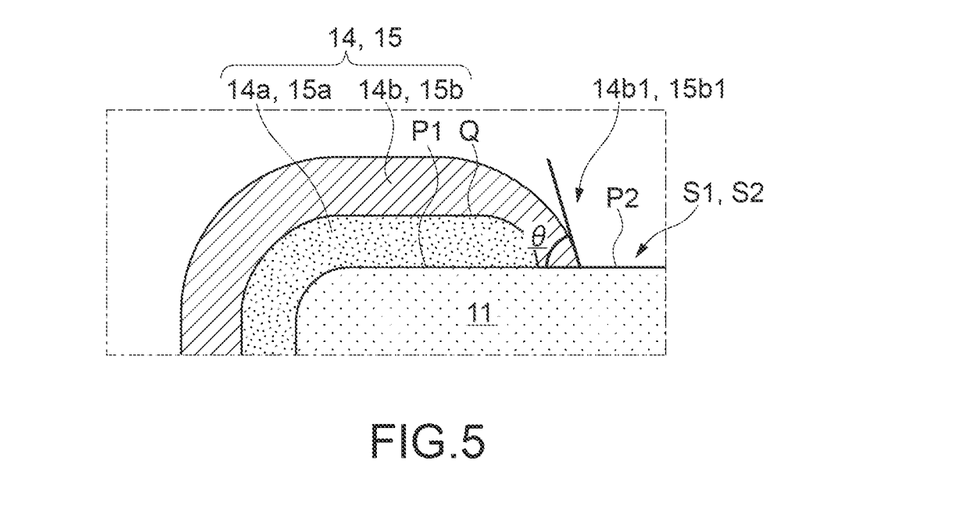
FIG. 5 is a partial cross-sectional view of an enlarged part of the multi-layer ceramic capacitor.

FIG. 5 is a partial cross-sectional view of the enlarged extending portions 14b1, 15b1 of the first and second plating layers 14b, 15b and the vicinity thereof in the multi-layer ceramic capacitor 10. In the multi-layer ceramic capacitor 10, the first and second external electrodes 14, 15 have a common configuration, and thus FIG. 5 shows the reference symbols of the first and second external electrodes 14, 15 together for convenience of description.

In the multi-layer ceramic capacitor 10, a difference ΔRa of a surface roughness Ra is small between the outer surface Q of the base layer 14a, 15a and the intermediate region P2 of the side surface S1, S2 of the ceramic body 11. Specifically, ΔRa is favorably 40 nm or less, more favorably 30 nm or less. Note that the magnitude relationship of the surface roughness Ra on each surface may be optionally set if ΔRa is small.

This configuration makes it possible to reduce a contact angle θ shown in FIG. 5, which is defined as the angle formed by the surface of the extending portion 14b1, 15b1 with respect to the intermediate region P2 of the side surface S1, S2 of the ceramic body 11, in the multi-layer ceramic capacitor 10. Specifically, the contact angle θ of the extending portion 14b1, 15b1 is favorably an acute angle.

In the external electrode 14, 15, the acute contact angle θ of the extending portion 14b1, 15b1 makes it difficult to apply an external force to the extending portion 14b1, 15b1 in a direction separate from the intermediate region P2 of the side surface S1, S2 of the ceramic body 11. As a result, bonding of the extending portion 14b1, 15b1 to the intermediate region P2 of the side surface S1, S2 of the ceramic body 11 is hardly hindered.

Thus, in the multi-layer ceramic capacitor 10, it is possible to prevent the first and second external electrodes 14, 15 from being peeled off starting from the extending portions 14b1, 15b1. Therefore, in the multi-layer ceramic capacitor 10, it is possible to prevent the occurrence of a problem such as a decrease in moisture resistance caused by peeling of the first and second external electrodes 14, 15, and thus possible to obtain high reliability.

The surface roughness Ra of the intermediate region P2 of the side surface S1, S2 of the ceramic body 11 is measurable in, for example, a region exposed without being covered with the plating layer 14b, 15b in the ceramic body 11.

Additionally, the surface roughness Ra of the outer surface Q of the base layer 14a, 15a is measurable by, for example, peeling off the plating layer 14b, 15b. For example, a plating stripping solution can be used for peeling off the plating layer 14b, 15b. More specifically, a plating stripping solution in which the multi-layer ceramic capacitor 10 is immersed is agitated, and thus the plating layer 14b, 15b can be peeled off to expose the base layer 14a, 15a.

In order to measure the surface roughness Ra of the intermediate region P2 of the side surface S1, S2 of the ceramic body 11 and the surface roughness Ra of the outer surface Q of the base layer 14a, 15a, a laser microscope (e.g., manufactured by Olympus Corporation, model number: OLS4100) may be used. Additionally, the measurement of the surface roughness Ra can be performed, for example, on a predetermined rectangular region (250 μm by 250 μm) on each surface. Additionally, in order to eliminate abnormal values, for example, the surface roughness Ra are measured at five points with a measurement length of 250 μm per point, and a value obtained by removing the maximum value and the minimum value from the five numerical values measured and then averaging the three remaining central values may be employed. Note that the surface roughness Ra means an arithmetic mean roughness.

In the outer surface Q of the base layer 14a, 15a, the surface roughness Ra is favorably 10 nm or more and less than 200 nm, more favorably 30 nm or more and less than 150 nm across the region thereof. Thus, in the multi-layer ceramic capacitor 10, the plating layer 14b, 15b having a uniform thickness over the entire region of the outer surface Q of the base layer 14a, 15a are easily formed.

Additionally, in the intermediate region P2 of the side surface S1, S2 of the ceramic body 11, the surface roughness Ra is favorably 10 nm or more and less than 150 nm, more favorably 20 nm or more and less than 120 nm. Thus, the contact angle θ of the extending portion 14b1, 15b1 with respect to the intermediate region P2 of the side surface S1, S2 of the ceramic body 11 is likely to be kept smaller.

The base layer 14a, 15a is typically formed of nickel (Ni) as a main component. However, the main component of the base layer 14a, 15a may be, for example, copper (Cu), palladium (Pd), silver (Ag), or the like other than nickel (Ni). In this embodiment, the main component means a component having the highest content ratio.

Additionally, the base layer 14a, 15a favorably contains a ceramic component in order to enhance the bondability to the ceramic body 11. The ceramic component contained in the base layer 14a, 15a is typically dielectric ceramics of a composition common to that of the ceramic body 11, but other ceramics may be used as necessary.

Further, in the multi-layer ceramic capacitor 10, the presence of a metal oxide having low electrical conductivity on the outer surface Q of the base layer 14a, 15a is likely to cause unevenness in the plating layer 14b, 15b. Therefore, a smaller amount of the metal oxide is favorable in the outer surface Q of the base layer 14a, 15a.

The plating layer 14b, 15b may have a single-layer structure of a single plating film or a laminated structure of a plurality of plating films. As an example, the plating layer 14b, 15b can have a laminated structure including a copper (Cu) film, a nickel (Ni) film, and a tin (Sn) film laminated in this order from the outer surface Q side of the base layer 14a, 15a.

3. Method of Producing Multi-Layer Ceramic Capacitor 10

Figure 6:
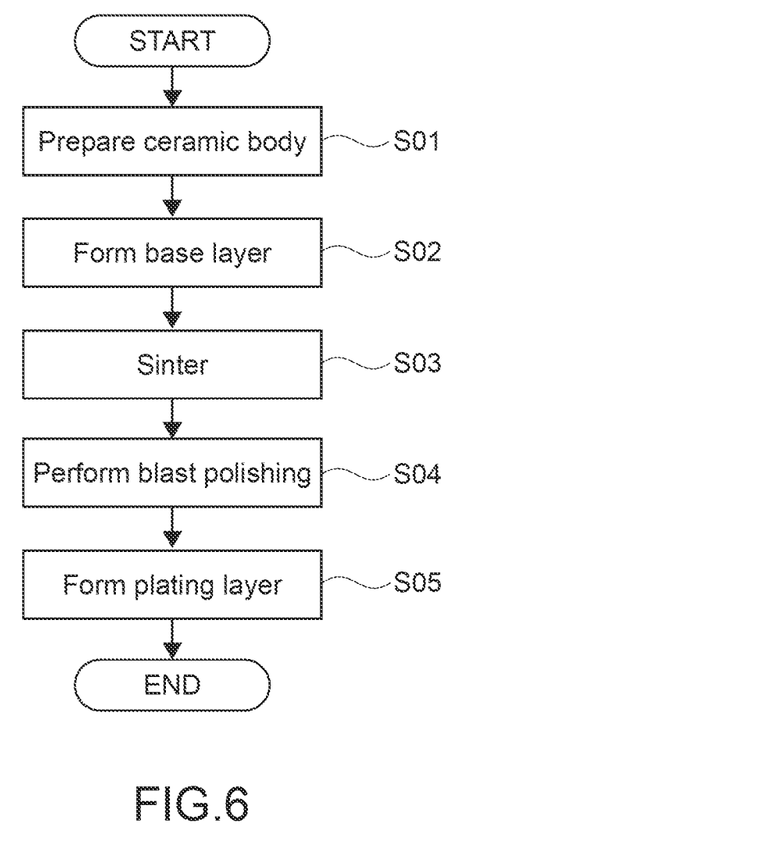
FIG. 6 is a flowchart showing a method of producing the multi-layer ceramic capacitor.

FIG. 6 is a flowchart showing a method of producing the multi-layer ceramic capacitor 10 according to this embodiment. FIGS. 7 to 11 are views each showing the process of producing the multi-layer ceramic capacitor 10. Hereinafter, the method of producing the multi-layer ceramic capacitor 10 will be described along FIG. 6 with reference to FIGS. 7 to 11 as appropriate.

3.1 Step S01: Preparation of Ceramic Body

Figure 7:
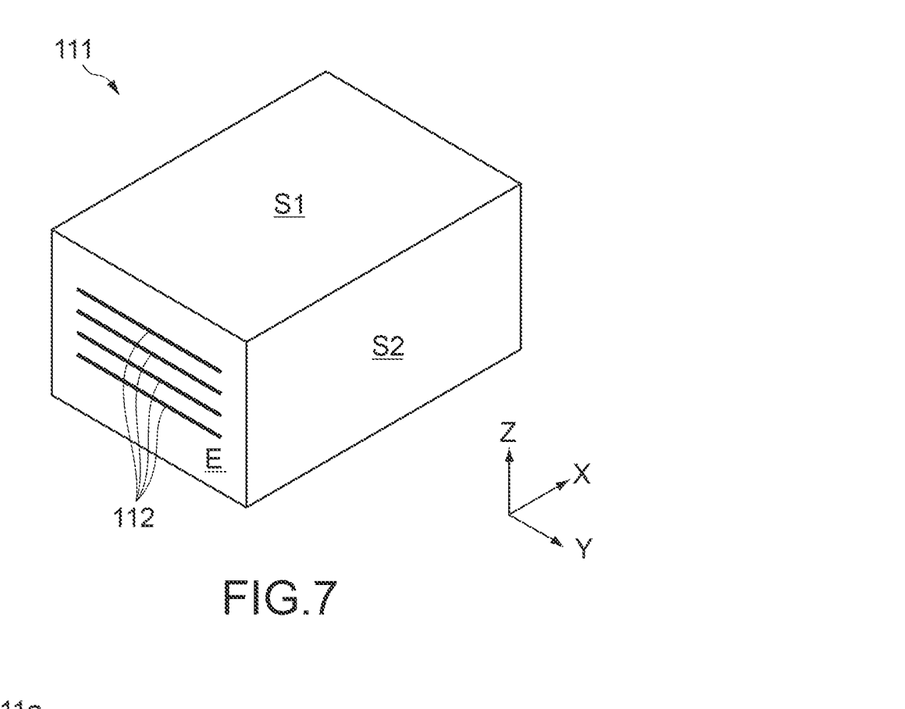
FIG. 7 is a perspective view of a ceramic body prepared in Step S01.

In Step S01, an unsintered ceramic body 111 shown in FIG. 7 is prepared. The unsintered ceramic body 111 is obtained by, for example, laminating and thermocompression-bonding a plurality of ceramic sheets in the Z-axis direction. An electrically conductive paste of a predetermined pattern is printed on each ceramic sheet in advance, and thus unsintered internal electrodes 112, 113 can be disposed.

The ceramic sheet is an unsintered dielectric green sheet obtained by forming ceramic slurry into a sheet shape. The ceramic sheet is formed into a sheet shape by using a roll coater or a doctor blade, for example. Components of the ceramic slurry are adjusted so as to obtain a ceramic body 11 with a predetermined composition.

3.2 Step S02: Formation of Base Layer

Figure 8:
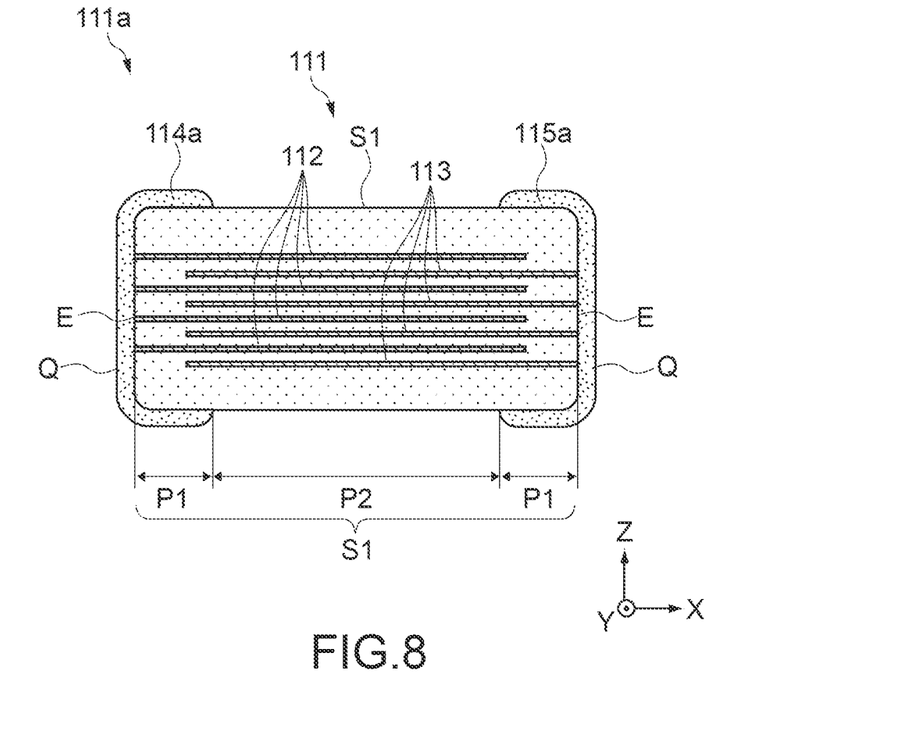
FIG. 8 is a cross-sectional view of a composite unsintered body obtained in Step S02.

In Step S02, unsintered base layers 114a, 115a are formed on the unsintered ceramic body 111 prepared in Step S01. Thus, a composite unsintered body 111a shown in FIG. 8 is obtained. The base layers 114a, 115a can be formed by, for example, applying an electrically conductive paste onto the ceramic body 111.

In the composite unsintered body 111a, for example, a ceramic component can be contained in the base layers 114a, 115a by mixing ceramic powder with an electrically conductive paste. Thus, in a composite sintered body 11a to be obtained after sintering, high bondability of the first and second base layers 14a, 15a to the ceramic body 11 is obtained.

3.3 Step S03: Sintering

Figure 9:
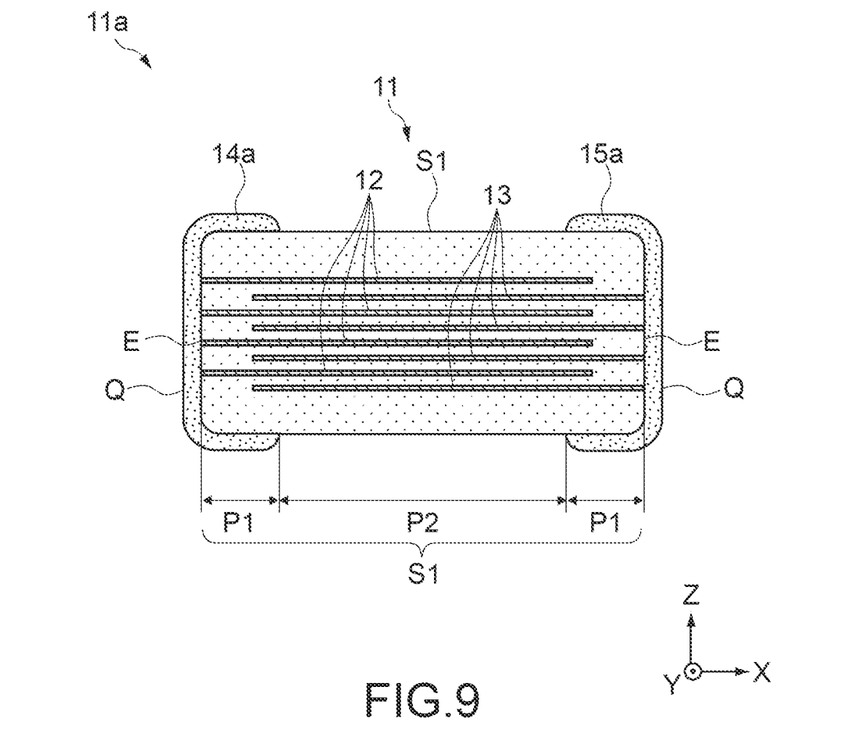
FIG. 9 is a cross-sectional view of a composite sintered body obtained in Step S03.

In Step S03, the composite unsintered body 111a obtained in Step S02 is sintered. As a result, the composite unsintered body 111a is sintered, and the composite sintered body 11a shown in FIG. 9 is obtained. Sintering of the composite unsintered body 111a can be performed in a reduction atmosphere or a low-oxygen partial pressure atmosphere, for example. The sintering conditions of the composite unsintered body 111a can be appropriately determined.

In Step S03, the ceramic body 111, and the base layers 114a, 115a connected to the internal electrodes 112, 113 exposed from the end surfaces E of the ceramic body 111, which constitute the composite unsintered body 111a, are simultaneously sintered. Thus, in the composite sintered body 11a obtained after sintering, favorable connection property between the first and second internal electrodes 12, 13 and the first and second base layers 14a, 15a can be obtained.

More specifically, the internal electrodes 112, 113 and the base layers 114a, 115a mainly containing metal start to shrink at a stage earlier than the ceramics constituting the ceramic body 111. The internal electrodes 112, 113 and the base layers 114a, 115a connected to each other in the unsintered stage integrally shrink, and thus the connection therebetween is likely to be maintained even after sintering.

Therefore, in the multi-layer ceramic capacitor 10, it is possible to ensure the connection between the first and second internal electrodes 12, 13 and the first and second external electrodes 14, 15. Thus, in the multi-layer ceramic capacitor 10, a decrease in capacitance due to poor connection between the first and second internal electrodes 12, 13 and the first and second external electrodes 14, 15, or an increase in equivalent series resistance (ESR) hardly occurs.

3.4 Step S04: Blast Polishing

In Step S04, the composite sintered body 11a obtained in Step S03 is subjected to blast polishing. In blast polishing, an abrasive of fine particles is blown to the composite sintered body 11a, to grind the outer surface Q of the base layer 14a, 15a constituting the outer surface of the composite sintered body 11a, and the intermediate region P2 of the side surface S1, S2 of the ceramic body 11.

The abrasive used in a blast polishing apparatus M only needs to have a sufficiently high hardness with respect to the composite sintered body 11a and can be formed of zirconia or alumina, for example. Additionally, the particle diameter of the abrasive only needs to be sufficiently small with respect to the composite sintered body 11a and can be set in the range of 10 μm to 1200 μm, for example.

The inventors of the present application have found that blast polishing is very excellent as pretreatment to be performed on the composite sintered body 11a in order to form the first and second plating layers 14b, 15b. In other words, if blast polishing is performed on the composite sintered body 11a, the entire outer surface of the composite sintered body 11a can be made suitable to form favorable plating layers 14b, 15b.

More particularly, in blast polishing, blowing a large amount of abrasive whose fine particles each have small energy makes it possible to uniform the impact applied to the outer surface of the composite sintered body 11a. Thus, in blast polishing, it is possible to smooth the uneven shape, that is, reduce the surface roughness Ra regardless of the processability of the surface to be treated.

Therefore, in the blast polishing for the composite sintered body 11a, it is possible to simultaneously reduce the surface roughness Ra of the surfaces to be treated that are greatly different in processability, i.e., the outer surface Q of the base layer 14a, 15a mainly containing metal and the intermediate region P2 of the side surface S1, S2 of the ceramic body 11 mainly containing ceramics.

Thus, by the blast polishing for the composite sintered body 11a, it is possible to reduce the difference ΔRa of the surface roughness Ra between the outer surface Q of the base layer 14a, 15a and the intermediate region P2 of the side surface S1, S2 of the ceramic body 11. In other words, in the multi-layer ceramic capacitor 10, a configuration having a small ΔRa can be achieved by blast polishing.

Additionally, in the blast polishing for the composite sintered body 11a, a metal oxide generated on the outer surface Q of the base layer 14a, 15a during sintering or the like can be uniformly removed. This improves electrical conductivity in the outer surface Q of the base layer 14a, 15a, which makes it possible to uniformly precipitate metal by a wet plating method.

The surface roughness Ra of the outer surface of the composite sintered body 11a, and the difference ΔR of the surface roughness Ra are adjustable depending on the conditions of blast polishing. Examples of the conditions of blast polishing include the type and the particle diameter of the abrasive, the amount of injection and the injection speed of the abrasive, and treatment time. Note that the blast polishing in Step S04 may be a dry method or a wet method, and any known technique is applicable as necessary.

Here, barrel polishing and chemical polishing, which are typical polishing techniques used in the process of producing the multi-layer ceramic capacitor 10, will be described. The barrel polishing and the chemical polishing fail to make the entire outer surface of the composite sintered body 11a suitable to form the favorable plating layer 14b, 15b as in the blast polishing according to this embodiment.

In other words, in the barrel polishing, the composite sintered bodies 11a are caused to collide with each other, and thus a large impact is unevenly applied to the outer surfaces of the composite sintered bodies 11a. Thus, in the barrel polishing, the difference ΔRa of the surface roughness Ra between the outer surface Q of the base layer 14a, 15a and the intermediate region P2 of the side surface S1, S2 of the ceramic body 11, which are greatly different in processability, is likely to increase.

In the chemical polishing, the outer surface of the composite sintered body 11a is melted. On the outer surface Q of the base layer 14a, 15a, the uneven shape is amplified by the melting, and thus the surface roughness Ra is likely to increase. Thus, the plating layer 14b, 15b formed on the outer surface Q of the base layer 14a, 15a is likely to cause unevenness.

In addition, in the chemical polishing as well, it is possible to melt and remove the metal oxide generated on the outer surface Q of the base layer 14a, 15a during sintering or the like. However, since the melting of the ceramic body 11 also progresses along with the melting of the metal oxide in the chemical polishing, defects in the outer shape and the lifetime of the multi-layer ceramic capacitor 10 tend to occur.

3.5 Step S05: Formation of Plating Layer

In Step S05, the first and second plating layers 14b, 15b are provided to the composite sintered body 11a subjected to the blast polishing in Step S04. The first and second plating layers 14b, 15b are formed by an electrolytic or electroless wet plating method. Thus, the first and second external electrodes 14, 15 are completed, and the multi-layer ceramic capacitor 10 shown in FIGS. 1 to 4 is obtained.

Figure 10:
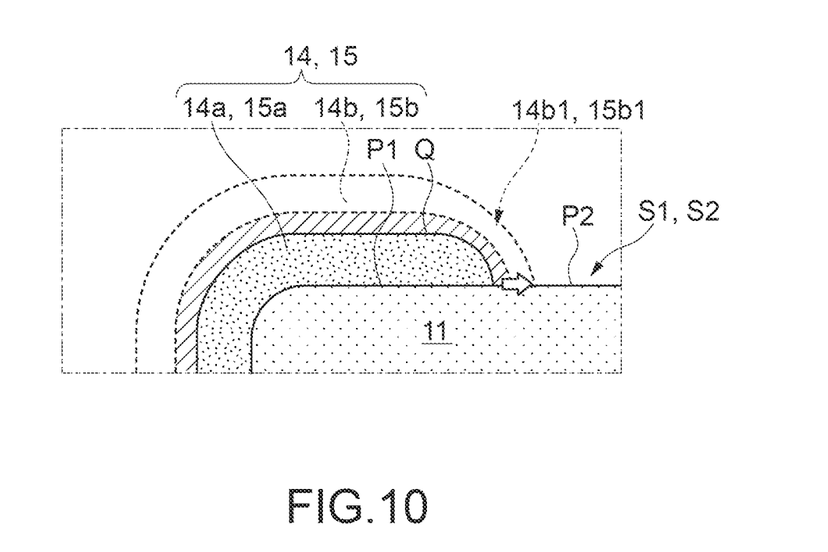
FIG. 10 is a partial cross-sectional view showing the process of forming a plating layer in Step S05.

FIG. 10 is a view showing the process of Step S05. The growth of the plating layer 14b, 15b is promoted on the outer surface Q of the base layer 14a, 15a having high electrical conductivity. Additionally, there is no unevenness in the electrical conductivity and the surface roughness Ra is small throughout the outer surface Q of the base layer 14a, 15a, and thus the growth of the plating layer 14b, 15b proceeds uniformly.

On the other hand, the plating layer 14b, 15b is hardly formed in the intermediate region P2 of the side surface S1, S2 of the ceramic body 11 having low electrical conductivity. Thus, the plating layer 14b, 15b is not formed in most of the region extending to the center in the X-axis direction in the intermediate region P2 of the side surface S1, S2 of the ceramic body 11.

However, in the intermediate region P2 of the side surface S1, S2 of the ceramic body 11 as well, the precipitation of metal occurs at both ends in the X-axis direction adjacent to the first and second base layers 14a, 15a, which is triggered by the precipitation of metal on the outer surfaces Q of the first and second base layers 14a, 15a. Thus, the extending portions 14b1, 15b1 of the first and second plating layers 14b, 15b are formed.

In particular, in this embodiment, the intermediate region P2 of the side surface S1, S2 of the ceramic body 11 has a surface roughness Ra close to, that is, a smoothness similar to that of the outer surface Q of the base layer 14a, 15a. Therefore, the intermediate region P2 of the side surface S1, S2 of the ceramic body 11 constitutes a smooth continuous surface together with the outer surface Q of the base layer 14a, 15a.

Thus, in the intermediate region P2 of the side surface S1, S2 of the ceramic body 11, the growth of the extending portions 14b1, 15b1 at both ends in the X-axis direction is promoted under the momentum of the growth of the first and second plating layers 14b, 15b on the outer surfaces Q of the first and second base layers 14a, 15a. As a result, the contact angle θ of the extending portion 14b1, 15b1 is reduced.

4. Example and Comparative Example

For each of Example and Comparative example of the present disclosure, 100 samples of the multi-layer ceramic capacitor 10 were produced by the production method similar to that described above, the samples having configurations with various differences ΔRa of the surface roughness R differentiated by changing the polishing conditions. The configurations of the multi-layer ceramic capacitor 10 are common except for the surface roughness Ra.

Figure 11:
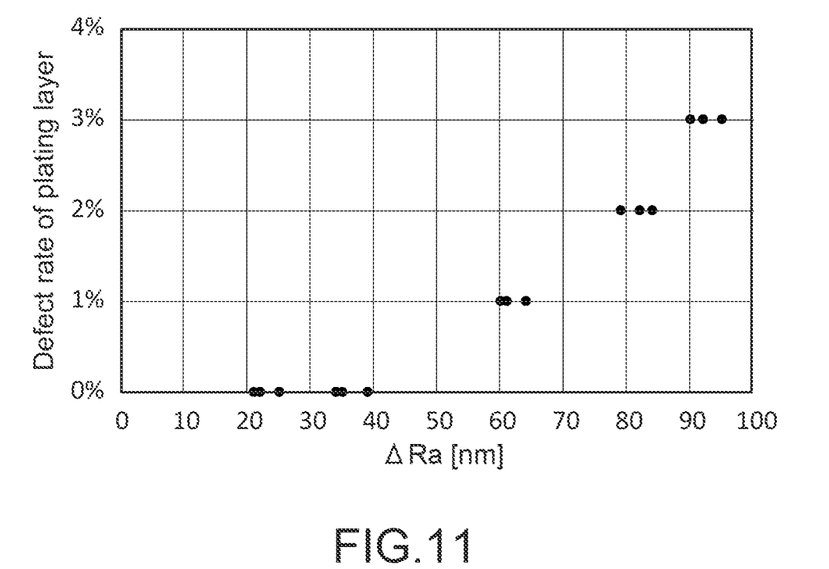
FIG. 11 is a graph showing a relationship between ΔRa and the defect rate of the plating layer.

In each configuration, the presence or absence of the occurrence of defects such as unevenness and peeling of the first and second plating layers 14b, 15b was evaluated, and the number of samples having defects that occurred in the first and second plating layers 14b, 15b was counted. FIG. 11 is a graph showing those results for each configuration, using plots in which the horizontal axis represents the difference ΔRa of the surface roughness R, and the vertical axis represents the defect rate of the first and second plating layers 14b, 15b.

As shown in FIG. 11, in the configuration in which the difference ΔRa of the surface roughness R is 40 nm or less, no defects occurred in the first and second plating layers 14b, 15b. In contrast, in the configuration in which the difference ΔRa of the surface roughness Ra exceeds 40 nm, as the difference ΔRa of the surface roughness R becomes larger, a larger number of defects tends to occur in the first and second plating layers 14b, 15b.

Additionally, it has been found that, in the configuration in which the difference ΔRa of the surface roughness Ra is 30 nm or less, particularly high solder wettability is obtained, and the first and second plating layers 14b, 15b can be more favorably formed. Further, it has been found that, in the configuration in which the difference ΔRa of the surface roughness Ra is 30 nm or less, the stress applied to the end regions P1 and the stress applied to the intermediate region P2 of the side surface S1, S2 are equal to each other in the ceramic body 11 in the process of forming the first and second plating layer 14b, 15b, and thus cracks hardly occur.

Note that, in order to make the difference ΔRa of the surface roughness Ra less than 10 μm, it is necessary to increase the treatment time for blast polishing and to improve the accuracy of the polishing conditions such as the particle diameter of the abrasive, which greatly increases the manufacturing cost. Therefore, the difference ΔRa of the surface roughness Ra is favorably limited to 10 μm or more.

5. Other Embodiments

While the embodiment of the present disclosure has been described, the present disclosure is not limited to the embodiment described above, and it should be appreciated that the present disclosure may be variously modified.

For example, the present disclosure is applicable not only to the multi-layer ceramic capacitor, but also to general ceramic electronic components each configured to include a pair of external electrodes. Examples of such ceramic electronic components to which the present disclosure is applicable include a chip varistor, a chip thermistor, and a multi-layer inductor, in addition to the multi-layer ceramic capacitor.

Figure 12:
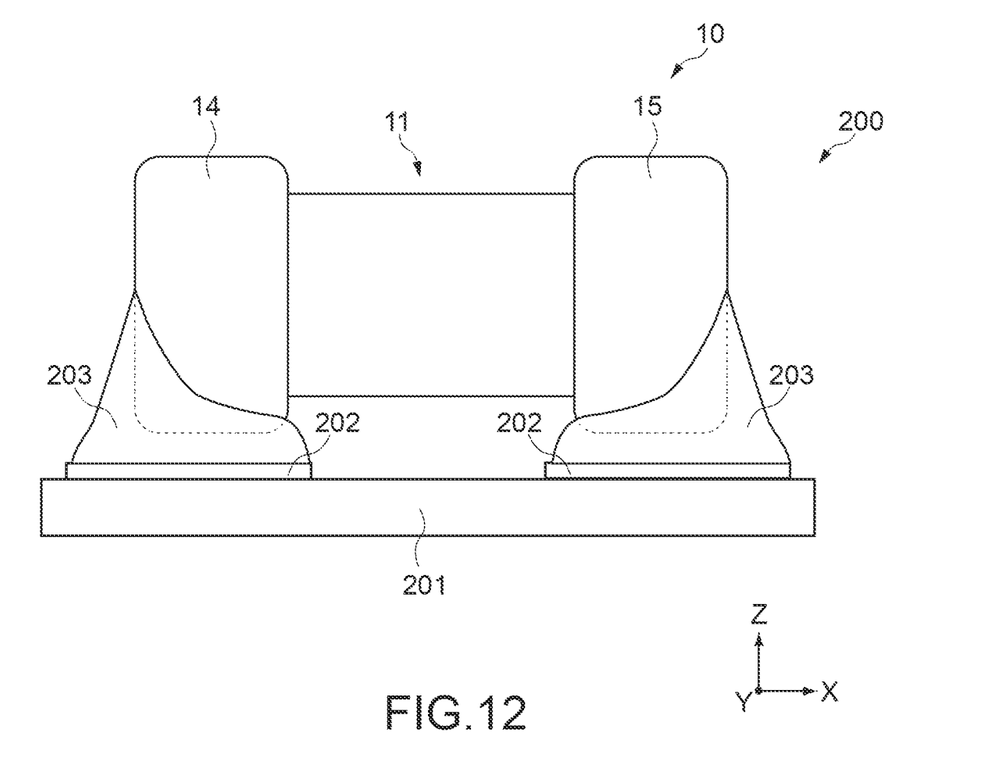
FIG. 12 is a side view of a circuit board including the multi-layer ceramic capacitor.

Additionally, the ceramic electronic component according to the present disclosure can be used to constitute a circuit board according to the present disclosure. As an example, a circuit board 200 shown in FIG. 12 includes the multi-layer ceramic capacitor 10 according to the above embodiment, a board main body 201, a pair of terminals 202, and a solder 203. The pair of terminals 202 are provided on the board main body 201. The first and second external electrodes 14, 15 of the multi-layer ceramic capacitor 10 are bonded to the pair of terminals 202 via the solder 203. In the circuit board 200, the first and second plating layers 14b, 15b of the first and second external electrodes 14, 15 have high solder wettability, and thus more reliable bondability through the solder 203 is obtained between the first and second external electrodes 14, 15 and the pair of terminals 202.

What is claimed is:

1. A ceramic electronic component, comprising:
a ceramic body including
a pair of end surfaces, and
a side surface that connects the pair of end surfaces and includes a pair of end regions adjacent to the pair of end surfaces and an intermediate region located between the pair of end regions; and
an external electrode including
a base layer that covers one of the pair of end surfaces and one of the pair of end regions of the side surface, includes an outer surface,
and is a sintered film of an electrical conductor, a difference of a surface roughness Ra of the outer surface with respect to the intermediate region of the side surface being 40 nm or less, and
a plating layer that covers the outer surface of the base layer and includes an extending portion extending from the outer surface of the base layer to the intermediate region of the side surface,
wherein a contact angle of each of the extending portion with respect to the intermediate region of the side surface is an acute angle, and
wherein the base layer is entirely constituted by a single layer of the sintered film of the electrical conductor.

2. The ceramic electronic component according to claim 1, wherein
the base layer contains nickel.

3. The ceramic electronic component according to claim 1, wherein
the base layer contains a ceramic component.

4. The ceramic electronic component according to claim 1, wherein
the difference of the surface roughness Ra between each of the outer surface of the base layer and the intermediate region of the side surface is 30 nm or less.

5. The ceramic electronic component according to claim 1, wherein
the surface roughness Ra of each of the outer surfaces of base layer is 10 nm or more and less than 200 nm.

6. The ceramic electronic component according to claim 1, wherein
the surface roughness Ra of the intermediate region is 10 nm or more and less than 150 nm.

7. A circuit board, comprising:
a ceramic body including
a pair of end surfaces, and
a side surface that connects the pair of end surfaces and includes a pair of end regions adjacent to the pair of end surfaces and an intermediate region located between the pair of end regions;
an external electrode including
a base layer that covers one of the pair of end surfaces and one of the pair of end regions of the side surface, includes an outer surface,
and is a sintered film of an electrical conductor, a difference of a surface roughness Ra of the outer surface with respect to the intermediate region of the side surface being 40 nm or less, and
a plating layer that covers the outer surface of the base layer and includes an extending portion extending from the outer surface of the base layer to the intermediate region of the side surface;
a board main body;
a terminal provided on the board main body; and
a solder that bonds the external electrode and the terminal to each other,
wherein a contact angle of each of the extending portion with respect to the intermediate region of the side surface is an acute angle, and
wherein the base layer is entirely constituted by a single layer of the sintered film of the electrical conductor.

8. A ceramic electronic component, comprising:
a ceramic body including
a pair of end surfaces, and
a side surface that connects the pair of end surfaces and includes a pair of end regions adjacent to the pair of end surfaces and an intermediate region located between the pair of end regions; and
an external electrode including
a base layer that covers one of the pair of end surfaces and one of the pair of end regions of the side surface, includes an outer surface,
and is a sintered film of an electrical conductor, a difference of a surface roughness Ra of the outer surface with respect to the intermediate region of the side surface being 40 nm or less, and a plating layer that covers the outer surface of the base layer, wherein a contact angle of each of the extending portion with respect to the intermediate region of the side surface is an acute angle, and wherein the base layer is entirely constituted by a single layer of the sintered film of the electrical conductor.

9. The ceramic electronic component according to claim 8, wherein the base layer contains nickel.

10. The ceramic electronic component according to claim 8, wherein the base layer contains a ceramic component.

11. The ceramic electronic component according to claim 8, wherein the difference of the surface roughness Ra between each of the outer surface of the base layer and the intermediate region of the side surface is 30 nm or less.

12. The ceramic electronic component according to claim 8, wherein the surface roughness Ra of each of the outer surfaces of base layer is 10 nm or more and less than 200 nm.

13. The ceramic electronic component according to claim 8, wherein the surface roughness Ra of the intermediate region is 10 nm or more and less than 150 nm.

* * * * *